US006864510B2

(12) United States Patent
Youn et al.

(10) Patent No.: US 6,864,510 B2
(45) Date of Patent: Mar. 8, 2005

(54) NITRIDE SEMICONDUCTOR FIELD EFFECT TRANSISTOR (FET) AND METHOD OF FABRICATING THE SAME

(75) Inventors: Doo Hyeb Youn, Daejeon (KR); Kyu Seok Lee, Daejeon (KR)

(73) Assignee: Electronics and Telecommunications Research Institute (KR)

(*) Notice: Subject to any disclaimer, the term of this patent is extended or adjusted under 35 U.S.C. 154(b) by 0 days.

(21) Appl. No.: 10/683,328

(22) Filed: Oct. 9, 2003

(65) Prior Publication Data

US 2004/0084697 A1 May 6, 2004

(30) Foreign Application Priority Data

Oct. 18, 2002 (KR) ............................ 10-2002-0063836

(51) Int. Cl.[7] ........................................ H01L 31/0256
(52) U.S. Cl. ..................... 257/81; 257/76; 257/79; 257/85; 257/99; 257/183; 257/200
(58) Field of Search ............... 257/76–103, 183–201, 257/754, 918, E21.172, E51.016

(56) References Cited

U.S. PATENT DOCUMENTS

| | | | | |
|---|---|---|---|---|
| 6,130,446 A | * | 10/2000 | Takeuchi et al. | 257/99 |
| 6,583,468 B2 | * | 6/2003 | Hori et al. | 257/327 |
| 6,656,823 B2 | * | 12/2003 | Lee et al. | 438/575 |
| 2003/0073274 A1 | * | 4/2003 | Lee | 438/200 |

OTHER PUBLICATIONS

Journal of Applied Physics, vol. 83, No. 6, Mar. 15, 1998, pp. 3172–3175.
Applied Physics Letters, vol. 69, No. 11, Sep. 9, 1996, pp. 1556–1558.

* cited by examiner

Primary Examiner—David Nelms
Assistant Examiner—Andy Huynh
(74) Attorney, Agent, or Firm—Blakely Sokoloff Taylor & Zafman

(57) ABSTRACT

Provided are a nitride semiconductor field effect transistor (FET) and a method of fabricating the nitride semiconductor FET. The nitride semiconductor FET includes a first semiconductor layer, a second semiconductor layer, a two-dimensional electron gas layer, a T-shaped gate, and a source/drain ohmic electrode. The first semiconductor layer is formed on a substrate. The second semiconductor layer is formed on the first semiconductor layer and has a bandgap energy that is different from the bandgap energy of the first semiconductor layer. The two-dimensional electron gas layer is formed of a hetero-junction of the first semiconductor layer and the second semiconductor layer in an interfacial area between the first semiconductor layer and the second semiconductor layer. The T-shaped gate is formed on the second semiconductor layer and is connected to the second semiconductor layer. The source/drain ohmic electrode is formed by sequentially forming an Ni (or Cr) layer, an In layer, an Mo (or W) layer, and an Au layer at both sides of the second semiconductor layer and on the first semiconductor layer.

9 Claims, 5 Drawing Sheets

NITRIDE SEMICONDUCTOR FIELD EFFECT TRANSISTOR (FET) AND METHOD OF FABRICATING THE SAME

CROSS REFERENCE TO RELATED APPLICATION

This application claims the priority of Korean Patent Application No. 2002-63836, filed on 18 Oct. 2002, in the Korean Intellectual Property Office, the disclosure of which is incorporated herein in its entirety by reference.

BACKGROUND OF THE INVENTION

1. Field of the Invention

The present invention relates to a nitride semiconductor field effect transistor (FET) and a method of fabricating the same, and more particularly, to a nitride semiconductor FET with an ohmic metal layer and a method of fabricating the same.

2. Description of the Related Art

Semiconductor materials such as Si or GaAS have been widely used for semiconductor device fabrication, but it has been found that they are difficult to apply to high-performance and high-frequency devices. Numerous attempts to develop alternative semiconductor materials have resulted in GaN compound semiconductors. GaN compound semiconductors are group-III nitrides with a wide bandgap energy, high thermal/chemical stability, high electronic mobility, and high electron saturation velocity. Thus, GaN compound semiconductors can be applied to new generation mobile communication systems or satellite communication systems which require high-performance and high-frequency, and to engine control systems requiring high thermal resistance.

However, during fabrication of a conventional nitride semiconductor FET, since the bandgap energy of a GaN layer is different from that of a source/drain ohmic electrode into which current flows, a bandgap offset is caused, and the bandgap offset forms a potential barrier.

Since current cannot smoothly flow into the source/drain ohmic electrode due to the potential barrier, a large voltage drop is caused between the GaN layer and the source/drain ohmic electrode. The large voltage drop increases a driving voltage of the nitride semiconductor FET, which reduces an operating efficiency of the nitride semiconductor FET.

Furthermore, if the driving voltage of the nitride semiconductor FET is increased to operate a high-performance device, a high-temperature exothermic reaction occurs and causes thermal degradation of electrode materials. As a result, the nitride semiconductor FET has a reduced operating efficiency and degraded electrode materials, which leads to degradation of the nitride semiconductor FET.

SUMMARY OF THE INVENTION

The present invention provides a nitride semiconductor field effect transistor (FET) in which current into a source/drain ohmic electrode is increased and thermal degradation of the source/drain ohmic electrode, caused due to a high-temperature exothermic reaction when the nitride semiconductor FET operates a high-performance device, is prevented.

The present invention also provides a method of fabricating the nitride semiconductor FET.

In accordance with the present invention, a nitride semiconductor field effect transistor (FET) includes a first semiconductor layer formed on a substrate, a second semiconductor layer, which is formed on the first semiconductor layer and has a bandgap energy that is different from the bandgap energy of the first semiconductor layer, and a two-dimensional electron gas layer, which is formed of a hetero-junction of the first semiconductor layer.

Further, the nitride semiconductor field effect transistor (FET) includes the second semiconductor layer in an interfacial area between the first semiconductor layer and the second semiconductor layer, and a T-shaped gate, which is formed on the second semiconductor layer and is connected to the second semiconductor layer, and a source/drain ohmic electrode, which is formed by sequentially forming an Ni (or Cr) layer, an In layer, an Mo (or W) layer, and an Au layer at both sides of the second semiconductor layer pattern and on the first semiconductor layer.

The first semiconductor layer may be a doped GaN layer or an undoped GaN layer. The second semiconductor layer pattern may be an AlGaN layer. The buffer layer may be further formed on the substrate.

Also, a nitride semiconductor field effect transistor (FET) includes a GaN layer formed on a substrate, an AlGaN layer pattern, which is formed on the GaN layer and has a bandgap energy that is different from the bandgap energy of the GaN layer, a two-dimensional electron gas layer, which is formed of a hetero-junction of the GaN layer and the AlGaN layer in an interfacial area between the GaN layer and the AlGaN layer pattern, a T-shaped gate, which is formed on the AlGaN layer pattern and is connected to the AlGaN layer pattern; and a source/drain ohmic electrode, which is formed by sequentially forming an Ni (or Cr) layer, an In layer, an Mo (or W) layer, and an Au layer at both sides of the AlGaN layer pattern and on the GaN layer.

In accordance with the present invention, a method of fabricating a nitride semiconductor field effect transistor (FET) includes sequentially forming a first semiconductor layer and a second semiconductor layer that have different bandgap energies on a substrate to form a hetero-junction, and forming a two-dimensional electron gas layer in an interfacial area between the first semiconductor layer and the second semiconductor layer.

Further, the method includes patterning the second semiconductor layer to form a patterned second semiconductor layer and a source/drain ohmic electrode formation region at both sides of the patterned second semiconductor layer and on the first semiconductor layer, and sequentially forming an Ni (or Cr) layer, an In layer, an Mo (W) layer, and an Au layer on the source/drain ohmic electrode formation region to form the source/drain ohmic electrode, and forming a T-shaped gate on the patterned second semiconductor layer, the T-shaped gate connected to the patterned second semiconductor layer.

The first semiconductor layer may be formed of a doped GaN layer or an undoped GaN layer. The patterned second semiconductor layer may be formed of an AlGaN layer. The buffer layer may be further formed on the substrate.

As described above, the source/drain ohmic electrode is formed of multiple metal layers including an Ni (or Cr) layer, an In layer, an Mo (or W) layer, and an Au layer. Thus, current into the source/drain ohmic electrode can be increased, and thermal degradation of the source/drain ohmic electrode, due to the high-temperature exothermic reaction, can be prevented.

BRIEF DESCRIPTION OF THE DRAWINGS

The above and other aspects and advantages of the present invention will become more apparent by describing in detail an exemplary embodiment thereof with reference to the attached drawings in which.

DETAILED DESCRIPTION OF THE INVENTION

Figure 1:
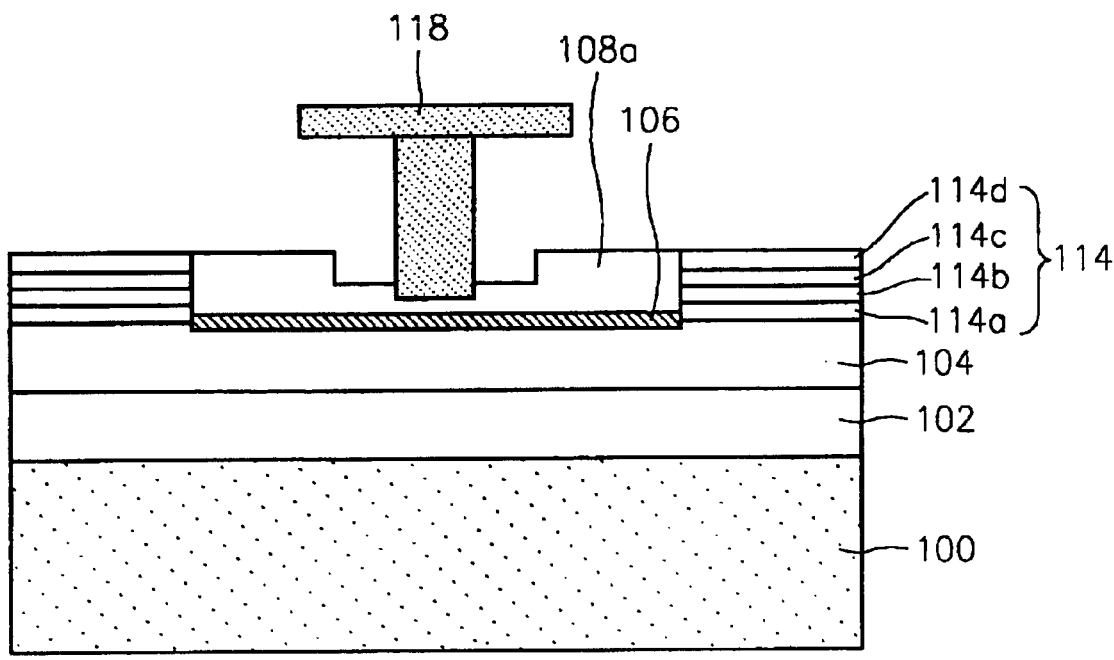
FIG. 1 is a sectional view of a nitride semiconductor field effect transistor (FET) according to the present invention.

The present invention will now be described more fully with reference to the accompanying drawings, in which a preferred embodiment of the invention is shown. This invention, however, may be embodied in many different forms and should not be construed as being limited to the embodiment set forth herein; rather, this embodiment is provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present.

FIG. 1 is a sectional view of a nitride semiconductor field effect transistor (FET) according to the present invention.

More specifically, a buffer layer 102 is formed on a substrate 100. A first semiconductor layer 104 is formed on the buffer layer 102. The buffer layer 102 is formed between the first semiconductor layer 104 and the substrate 100 to prevent crystal defects from occurring due to a difference between crystal lattice constants of the substrate 100 and the first semiconductor layer 104. The first semiconductor layer 104 is a GaN layer, and preferably, an undoped GaN layer.

A patterned second semiconductor layer 108a is formed on the first semiconductor layer 104 and has a bandgap energy that is different from that of the first semiconductor layer 104 to form a hetero-junction with the first semiconductor layer 104. The patterned second semiconductor layer 108a is an AlGaN layer. The first semiconductor layer 104 functions as an electron supply layer. The patterned second semiconductor layer 108a functions as a channel layer.

A thin two-dimensional electron gas layer 106 is formed of a hetero-junction of the first semiconductor layer 104 and the patterned second semiconductor layer 108a in the interfacial area between the first semiconductor layer 104 and the patterned second semiconductor layer 108a due to the bandgap discontinuity between the first semiconductor layer 104 and the patterned second semiconductor layer 108a.

A T-shaped gate 118 is formed on the patterned second semiconductor layer 108a and is connected to the patterned second semiconductor layer 108a. A source/drain ohmic electrode 114 is formed at both sides of the patterned second semiconductor layer 108a and on the first semiconductor layer 104.

The source/drain ohmic electrode 114 is formed by sequentially depositing an Ni (or Cr) layer, an In layer, an Mo (or W) layer, and an Au layer on the first semiconductor layer 104 and performing a thermal process on the deposited structure. The Ni (or Cr) layer and the In layer lower a potential barrier between the first semiconductor layer 104, i.e., the GaN layer, and the source/drain ohmic electrode 114, using an InGaN compound and a NiGa compound, formed as a result of an interfacial reaction of Ni (or Cr) and In during the thermal process. Thus, the current into the source/drain ohmic electrode 114 can be increased, and thermal stability of the source/drain ohmic electrode 114 can be achieved when a high-performance device operates at high temperature. The Mo (or W) layer is disposed between the In layer and the Au layer, used for diffusion barrier, and prevents ohmic resistance due to heat diffusion in the Au layer when the high-performance device operates at high temperature.

FIGS. 2 through 6 are sectional views for explaining a method of fabricating the nitride semiconductor FET, according to the present invention.

Figure 2:
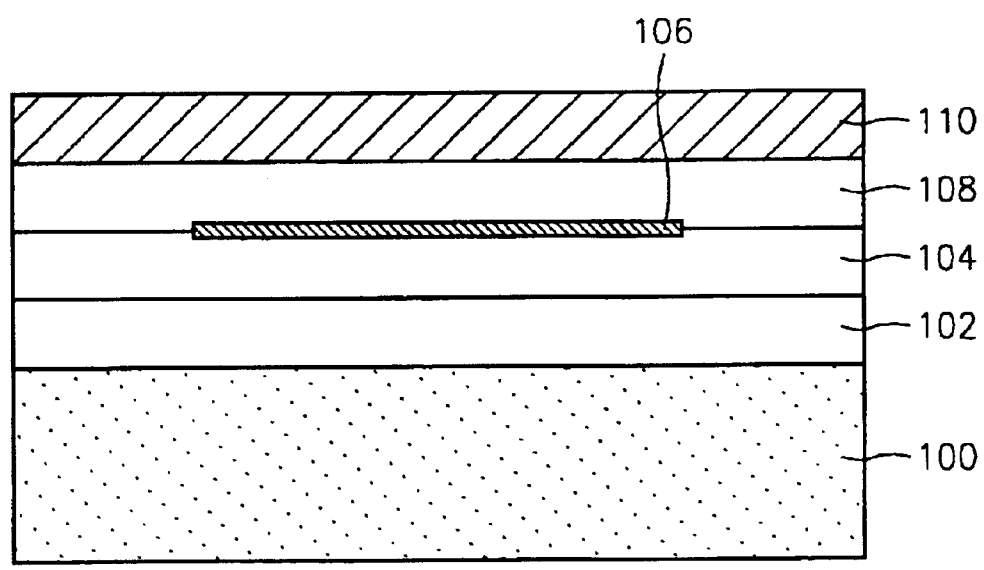
FIGS. 2 through 6 are sectional views for explaining a method of fabricating the nitride semiconductor FET, according to the present invention.

Referring to FIG. 2, the buffer layer 102 is formed on the substrate 100. The substrate 100 is a sapphire substrate. The buffer layer 102 is formed between the first semiconductor layer 104 and the substrate 100 to prevent crystal defects from occurring due to the difference between crystal lattice constants of the substrate 100 and the first semiconductor layer 104.

The first semiconductor layer 104 and a second semiconductor layer 108 are sequentially formed on the buffer layer 102 to form a hetero-junction on the buffer layer 102. The first semiconductor layer 104 and the second semiconductor layer 108 have different bandgap energies. The first semiconductor layer 104 is a GaN layer, and preferably, an undoped GaN layer. The second semiconductor layer 108 is an AlGaN layer. The first semiconductor layer 104 functions as an electron supply layer. The second semiconductor layer 108 functions as a channel layer.

The thin two-dimensional electron gas layer 106 is formed of a hetero-junction of the first semiconductor layer 104 and the second semiconductor layer 108 in the interfacial area of the first semiconductor layer 104 and the second semiconductor layer 108 due to bandgap discontinuity between the first semiconductor layer 104 and the second semiconductor layer 108.

A first photoresist film 110 is formed on the second semiconductor layer 108. The first photoresist film 110 is used when the second semiconductor 108 is patterned and a source/drain ohmic electrode is formed.

Figure 3:
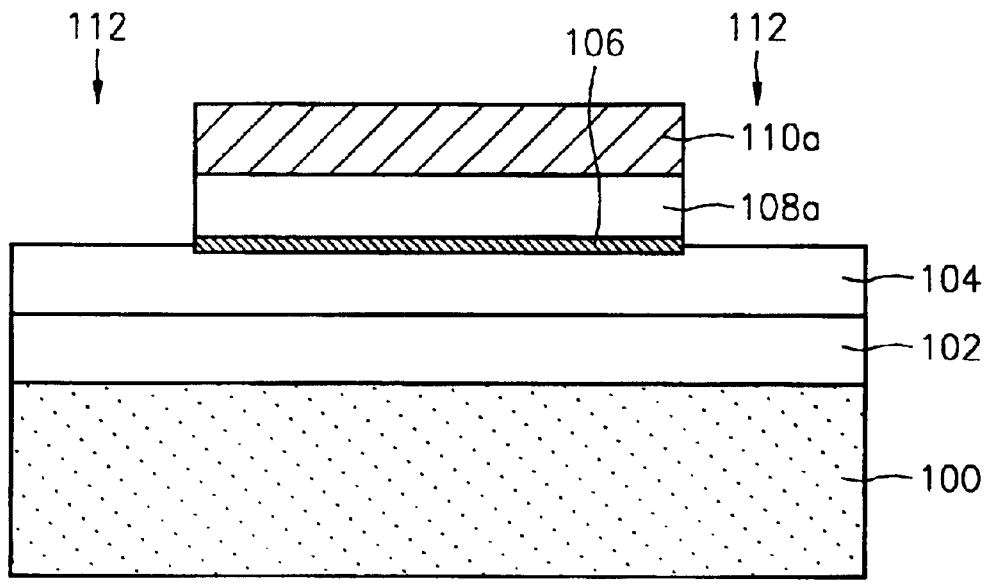

Referring to FIG. 3, the first photoresist film 110 is patterned to form a first photoresist pattern 110a. The second semiconductor layer 108 is etched using the first photoresist pattern 110a as an etch-mask. As a result, a patterned second semiconductor layer 108a is formed and a source/drain Ohmic electrode formation region 112 is formed at both sides of the patterned second semiconductor layer 108a and on the first semiconductor layer 104.

Figure 4:
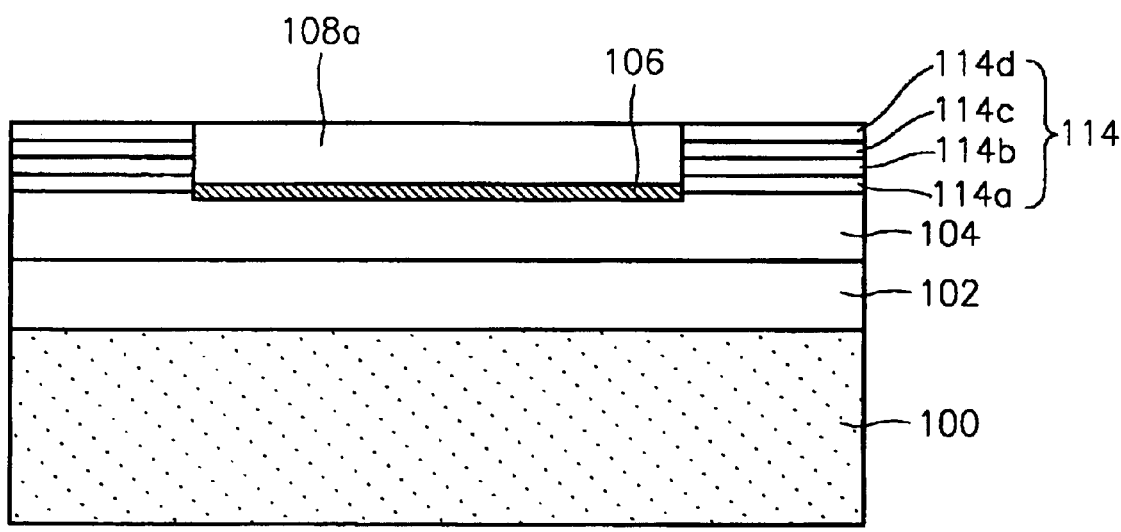

Referring to FIG. 4, the first photoresist pattern 110a is removed. Then the source/drain ohmic electrode 114 is formed in the source/drain ohmic electrode formation region 112. The source/drain ohmic electrode 114 is formed by sequentially depositing multiple metal layers and performing a thermal process on the deposited structure on the first semiconductor layer 104. The multiple metal layers are formed of an Ni (or Cr) layer 114a, an In layer 114b, an Mo (or W) layer 114c, and an Au layer 114d.

Hereinafter, the function of each multiple metal layer will be described.

The Ni (or Cr) layer 114a is the first metal layer and contacts the first semiconductor layer 104, i.e., the GaN layer. The Ni (or Cr) layer 114a induces an interfacial reaction between the Ni (or Cr) layer 114a and the first semiconductor layer 104, i.e., the GaN layer, during the thermal process at high temperature. Such an interfacial reaction allows for formation of a NiGa compound that has a high thermal reaction temperature, i.e., a high melting point. As a result, the source/drain ohmic electrode 114 can maintain thermal stability when the high-performance device operates at high temperature.

The In layer 114b is the second metal layer deposited on the first semiconductor layer 104. The In layer 114b induces the interfacial reaction between the In layer 114b and the GaN layer with a large work function value, during the thermal process at high temperature, and forms an InGaN layer with a bandgap energy smaller than that of the GaN layer. As a result, the potential barrier between the GaN layer and the source/drain ohmic electrode 114 becomes low. Thus, the characteristics of the source/drain ohmic electrode 114 are optimised. In other words, the In layer 114b lowers the potential barrier between the In layer 114b and the GaN layer by creating a new compound with a bandgap energy that is smaller than that of the GaN layer and larger than that of the In layer 114b, which increases current into the source/drain ohmic electrode 114.

The Mo (or W) layer 114c is the third metal layer deposited on the first semiconductor layer 104. The Mo (or W) layer 114c is disposed between the In layer 114b and the Au layer 114d, used for diffusion barrier, and prevents ohmic resistance due to heat diffusion in the Au layer 114d, during the thermal process at high temperature.

The Au layer 114d is the fourth metal layer deposited on the first semiconductor layer 104. The Au layer 114d is evaporated on the top of the source/drain Ohmic electrode 114 for wire boding. The Au layer 114d has a schottky characteristic and has a low current characteristic. However, if current flows into the Ni layer 114a and the In layer 114b due to thermal diffusion during the thermal process at high temperature, the Ohmic characteristics of the Ni layer 114a and the In layer 114b are degraded.

Figure 5:
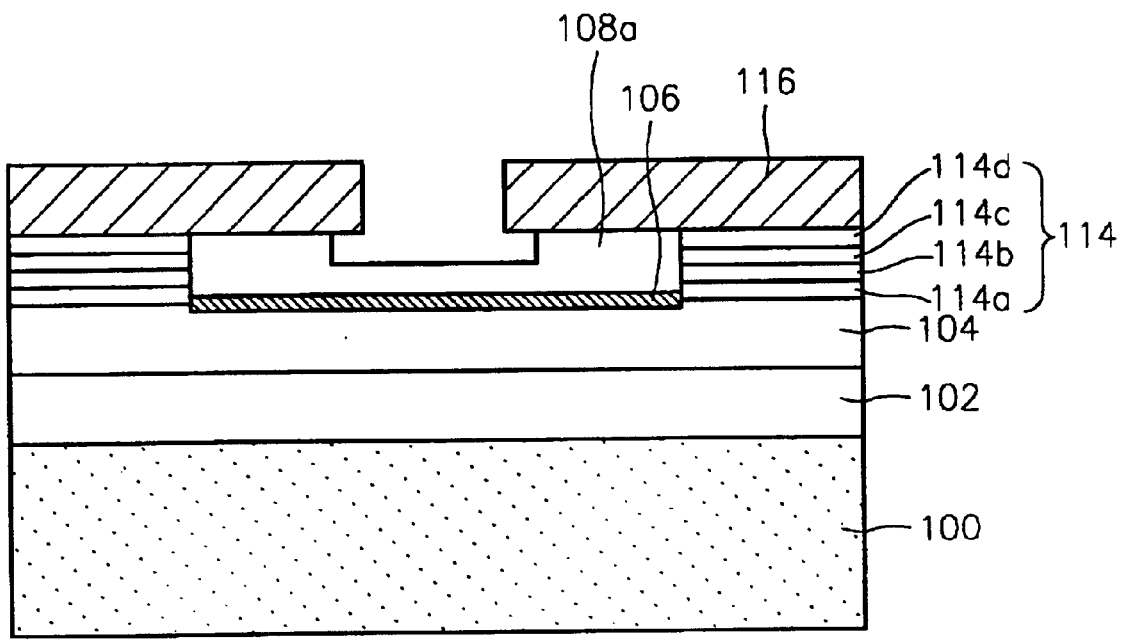

Referring to FIG. 5, a second photoresist pattern 116 is formed on the patterned second semiconductor layer 108a and the source/drain ohmic electrode 114 to partially expose the patterned second semiconductor layer 108a. Then the surface of the patterned second semiconductor layer 108a is partially etched to a shallow depth, using the second photoresist pattern 116 as a mask.

Figure 6:
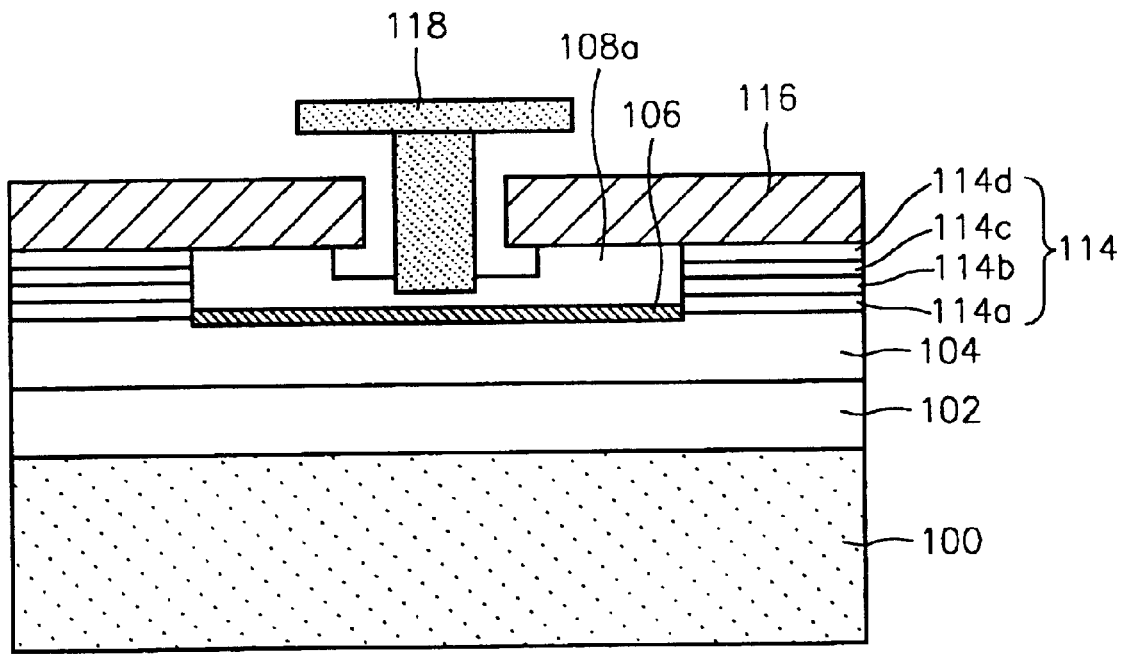

Referring to FIG. 6, the T-shaped gate 118 is formed and connected to the exposed patterned second semiconductor layer 108a. Then the second photoresist pattern 116 is removed. As a result, the nitride semiconductor FET shown in FIG. 1 is completed.

Figure 7A:
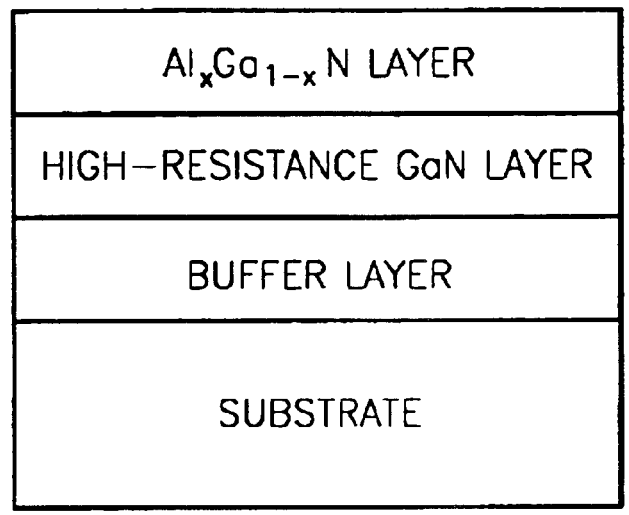
FIGS. 7A through 7B are views for explaining formation of a two-dimensional electron gas layer of the nitride semiconductor FET according to the present invention.
Figure 7B:
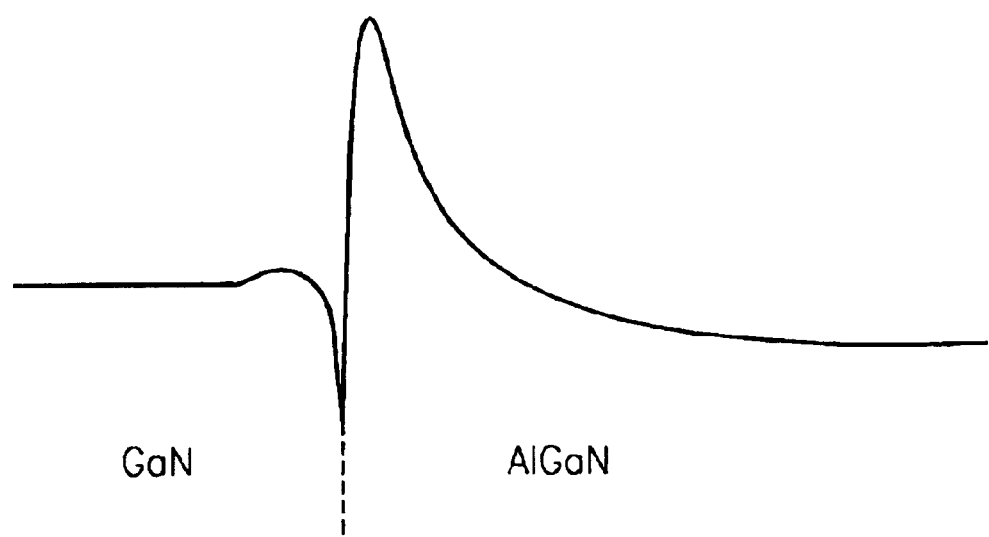

FIGS. 7A and 7B are views for explaining formation of the two-dimensional electron gas layer 106 of the nitride semiconductor FET according to the present invention.

More specifically, in FIG. 7A, a buffer layer, a high-resistance GaN layer, and an $Al_xGa_{1-x}N$ layer are sequentially deposited on a substrate. FIG. 7B shows bandgap energies of the GaN layer and the AlGaN layer of FIG. 7A. As shown in FIG. 7B, the two-dimensional electron gas layer is formed of a hetero-junction of the GaN layer and the AlGaN layer that have different bandgap energies. In particular, a V-shaped potential structure is formed in the interfacial area between the GaN layer and the AlGaN layer due to the difference between bandgap energies of the GaN layer and the AlGaN layer.

Figure 8:
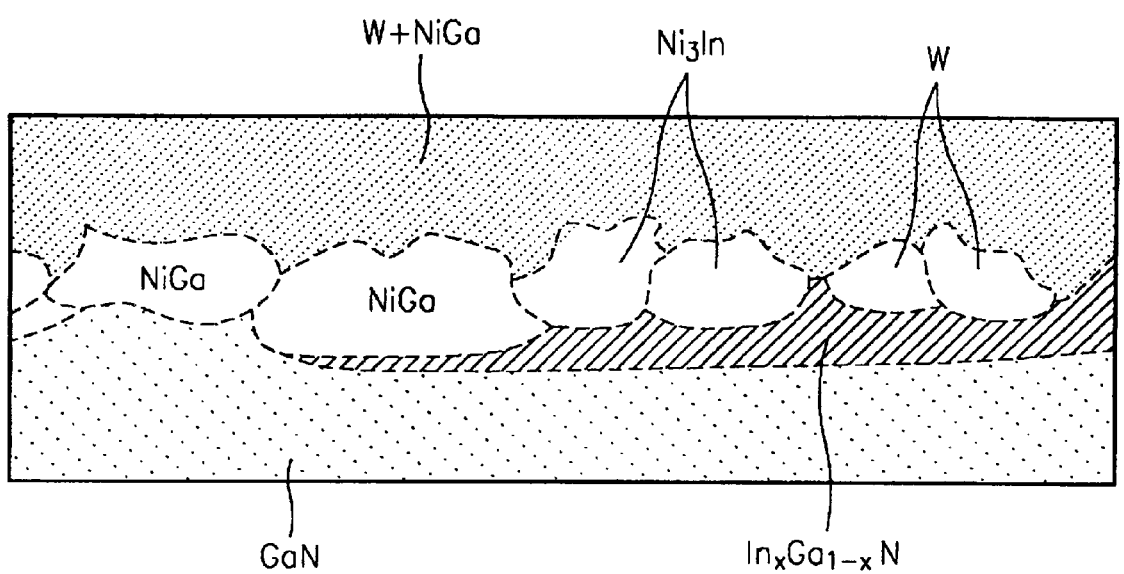
FIG. 8 is a view for explaining an interfacial reaction between a first semiconductor layer of the nitride semiconductor FET, i.e., a GaN layer, and a source/drain ohmic electrode, according to the present invention.

FIG. 8 is a view for explaining the interfacial reaction between the first semiconductor layer 104 of the nitride semiconductor FET, i.e., the GaN layer, and the source/drain ohmic electrode 114.

More specifically, the interfacial reaction between the GaN layer and the Ni layer 114a allows for formation of the NiGa compound that has a high thermal reaction temperature, i.e., a high melting point. The NiGa compound includes W and NiGa. By inducing the interfacial reaction between the GaN layer and the In layer 114b, the InGaN with the bandgap energy smaller than that of the GaN layer is formed. The Ni layer 114a and the In layer 114b are reacted and create an NiIn compound on the GaN layer.

As described above, in the nitride semiconductor FET of the present invention, the source/drain ohmic electrode is formed by sequentially depositing the Ni (or Ci) layer, the In layer, the Mo (or W) layer, and the Au layer on the first semiconductor layer, i.e., the GaN layer, and performing the thermal process on the deposited structure.

By using the InGaN compound and the NiGa compound, formed by the interfacial reaction between the Ni (or Cr) layer and the In layer during the thermal process, the potential barrier between the GaN layer and the source/drain ohmic electrode is lowered, and current into the source/drain ohmic electrode 114 is increased. Furthermore, the source/drain ohmic electrode 114 can be thermally stabilized when a high-performance device operates at high temperature.

The Mo (or W) layer is inserted between the In layer and the Au layer, used for diffusion barrier, and prevents ohmic resistance due to heat diffusion in the Au layer during the thermal process at high temperature.

While the present invention has been particularly shown and described with reference to an exemplary embodiment thereof, it will be understood by those of ordinary skill in the art that various changes in form and details may be made therein without departing from the spirit and scope of the invention as defined by the appended claims and their equivalents.

What is claimed is:

1. A nitride semiconductor field effect transistor (FET) comprising:

a first semiconductor layer formed on a substrate;

a second semiconductor layer, which is formed on the first semiconductor layer and has a bandgap energy that is different from the bandgap energy of the first semiconductor layer;

a two-dimensional electron gas layer, which is formed of a hetero-junction of the first semiconductor layer and the second semiconductor layer in an interfacial area between the first semiconductor layer and the second semiconductor layer;

a T-shaped gate, which is formed on the second semiconductor layer and is connected to the second semiconductor layer; and a source/drain ohmic electrode, which is formed by sequentially forming an Ni (or Cr) layer, an In layer, an Mo (or W) layer, and an Au layer at both sides of the second semiconductor layer and on the first semiconductor layer.

2. The nitride semiconductor FET of claim 1, wherein the first semiconductor layer is a doped GaN layer or an undoped GaN layer.

3. The nitride semiconductor FET of claim 1, wherein second semiconductor layer is an AlGaN layer.

4. The nitride semiconductor FET of claim 1, wherein a buffer layer is further formed on the substrate.

5. A nitride semiconductor field effect transistor (FET) comprising:

a GaN layer formed on a substrate;

an AlGaN layer pattern, which is formed on the GaN layer and has a bandgap energy that is different from the bandgap energy of the GaN layer;

a two-dimensional electron gas layer, which is formed of a hetero-junction of the GaN layer and the AlGaN layer in an interfacial area between the GaN layer and the AlGaN layer;

a T-shaped gate, which is formed on the AlGaN layer and is connected to the AlGaN layer; and a source/drain ohmic electrode, which is formed by sequentially forming an Ni (or Cr) layer, an In layer, an Mo (or W) layer, and an Au layer at both sides of the AlGaN layer and on the GaN layer.

6. A method of fabricating a nitride semiconductor field effect transistor (FET), the method comprising;

sequentially forming a first semiconductor layer and a second semiconductor layer that have different bandgap energies on a substrate to form a hetero-junction, and forming a two-dimensional electron gas layer in an interfacial area between the first semiconductor layer and the second semiconductor layer;

patterning the second semiconductor layer to form a patterned second semiconductor layer and a source/drain ohmic electrode formation region at both sides of the patterned second semiconductor layer and on the first semiconductor layer;

sequentially forming an Ni (or Cr) layer, an In layer, an Mo (W) layer, and an Au layer on the source/drain ohmic electrode formation region to form the source/drain ohmic electrode; and forming a T-shaped gate on the patterned second semiconductor layer, the T-shaped gate connected to the patterned second semiconductor layer.

7. The method of claim 6, wherein the first semiconductor layer is a doped GaN layer or an undoped GaN layer.

8. The method of claim 6, wherein the second semiconductor layer is an AlGaN layer.

9. The method of claim 6, wherein a buffer layer is further formed on the substrate.

* * * * *